United States Patent
Yim et al.

(10) Patent No.: US 7,689,761 B2
(45) Date of Patent: Mar. 30, 2010

(54) DATA STORAGE SYSTEM WITH COMPLEX MEMORY AND METHOD OF OPERATING THE SAME

(75) Inventors: Keunsoo Yim, Yongin-si (KR); Jeongjoon Yoo, Yongin-si (KR); Jungkeun Park, Seoul (KR)

(73) Assignee: Samsung Electronics Co., Ltd., Suwon-Si (KR)

(*) Notice: Subject to any disclaimer, the term of this patent is extended or adjusted under 35 U.S.C. 154(b) by 672 days.

(21) Appl. No.: 11/485,346

(22) Filed: Jul. 13, 2006

(65) Prior Publication Data

US 2007/0038808 A1 Feb. 15, 2007
US 2009/0144501 A2 Jun. 4, 2009

(30) Foreign Application Priority Data

Jul. 13, 2005 (KR) .................. 10-2005-0063301
Aug. 19, 2005 (KR) .................. 10-2005-0076368

(51) Int. Cl.
*G06F 13/00* (2006.01)

(52) U.S. Cl. ............... 711/103; 711/118; 711/120; 711/E12.008

(58) Field of Classification Search .......... 711/103
See application file for complete search history.

(56) References Cited

U.S. PATENT DOCUMENTS

| | | | | |
|---|---|---|---|---|
| 4,740,894 A | * | 4/1988 | Lyon | ............... 711/149 |
| 5,671,388 A | * | 9/1997 | Hasbun | ............... 711/103 |
| 5,937,423 A | * | 8/1999 | Robinson | ............... 711/103 |
| 6,014,727 A | * | 1/2000 | Creemer | ............... 711/118 |
| 6,233,648 B1 | * | 5/2001 | Tomita | ............... 711/4 |
| 6,311,290 B1 | | 10/2001 | Hasbun et al. | |
| 6,425,064 B2 | * | 7/2002 | Soderquist | ............... 711/171 |
| 6,427,186 B1 | * | 7/2002 | Lin et al. | ............... 711/103 |
| 2004/0186946 A1 | * | 9/2004 | Lee | ............... 711/103 |
| 2004/0193782 A1 | | 9/2004 | Bordui | |

FOREIGN PATENT DOCUMENTS

KR 1020040100262 12/2004

OTHER PUBLICATIONS

J. Kim et al., *A Space-Efficient Flash Translation Layer for Compact Flash Systems*, IEEE Transactions on Consumer Electronics, vol. 48, No. 2, May 2002, pp. 366-375 (10 pp.).

* cited by examiner

*Primary Examiner*—Reginald G Bragdon
*Assistant Examiner*—Larry T Mackall (57) ABSTRACT

A data storage system and a data storing method for the data storage system are provided. The data storage system includes a host unit, a storage unit, and a first input/output bus functioning as an interface between the host unit and the storage unit. The storage unit includes a non-volatile memory buffer unit and a flash memory unit. The non-volatile memory buffer unit includes a plurality of buffers arranged in parallel. The flash memory unit includes a plurality of data storage devices arranged in parallel to input and output data using a parallel method. In the method, a writing request is first classified into one of a plurality of grades according to a writing request frequency when there is a writing request and the writing requested data is stored in one of the non-volatile memory buffer unit and the flash memory unit according to the writing request frequency.

40 Claims, 8 Drawing Sheets

DATA STORAGE SYSTEM WITH COMPLEX MEMORY AND METHOD OF OPERATING THE SAME

CROSS-REFERENCE TO RELATED PATENT APPLICATION

This application claims the benefit of Korean Patent Application No. 10-2005-0063301, filed on Jul. 13, 2005, and Korean Patent Application No. 10-2005-0076368, filed on Aug. 19, 2005 in the Korean Intellectual Property Office, the disclosure of which is incorporated herein in its entirety by reference.

BACKGROUND OF THE INVENTION

1. Field of the Invention

The present invention relates to a data storage system and method of operating the same, and more particularly, to a data storage system with a complex memory comprising a flash memory and a method of operating the data storage system.

2. Description of the Related Art

Data storage systems using a flash memory device have been widely used in an embedded system and a mobile system. The data storage system using a flash memory device is one of electrically erasable programmable read-only memories (EEPROMs) on and from which the data can be written, read, and erased. While reading speed of the data storage system using a flash memory device is fast, writing and erasing speeds thereof are slow.

In the data storage system using a flash memory device, the data input/output unit is a page of 2-Bytes or 4-Bytes for a NOR-type flash memory device and 512-Bytes or 2-Kbytes for a NAND-type flash memory device. In addition, the erasing operation unit is a block of 128-Kbytes for the NOR-type flash memory device and 16-Kbytes or 64-Kbytes for the NAN D-type flash memory device.

That is, for the NOR-type flash memory device, it takes about 400 μs to write 2-Bytes. For the NAND-type flash memory device, it takes about 220 μs to write 512-Bytes and takes about 2 ms-2 s to erase 512-Bytes. That is, for the NAND-type memory device, the erasing operation is relatively slow.

In contrast, for a random access memory (RAM) device, it takes several tens of nano seconds to store a word. That is, the writing speed of data storage systems using the flash memory device is far slower than that of the RAM device.

Accordingly, a flash memory device is generally used as a code memory device that does not frequently undergo writing operations or an auxiliary memory device of which writing performance is not important. In addition, a data storage system using a flash memory device cannot perform real-time data storing operation. Thus, there are limitations in using the data storage systems using a flash memory device in a digital product such as a digital camera or a digital camcorder.

Therefore, a technology for logically and effectively hiding the erasing operation using a flash translation layer (FTL) employed using hardware or software has been developed (refer to U.S. Pat. No. 6,311,290 to J. Kim, et al. and "A space-Efficient Flash Translation Layer for Compact Flash systems" IEEE Trans. Consumer Elec., Vol. 48, No. 2 pp, 366-375, 2002).

However, even when the erasing operation is hidden using the FTL, the writing speed of flash memory devices are still slow compared to RAM devices. Thus, in the case of storing mass data, the writing speed of a data storage system using a flash memory is less than that of a RAM device. Due to this, a flash memory device is generally used as a code memory device that does not frequently undergo writing operations or as an auxiliary memory device of which writing performance is not important. Particularly, flash memory devices are very limited in being used in a device such as the digital camera, camcorder and mobile phone that process and store data in real-time.

An input/output buffer (or cash) is used to improve the input/output performance of the flash memory device. Korean Patent Application No. 2003-32552 discloses a data storage system that uses an SRAM or DRAM as the input/output buffer (or cash). US Patent Application No. 2004/0193782 A1 discloses a data storage system that improves writing performance by using a magnetic RAM as a writing buffer.

In the data storage system disclosed in Korean Patent Application No. 2003-32552, input performance can be improved by maintaining data that is frequently accessed in the cash, which has a fast input/output speed, using a temporal-spatial locality appearing in an input/output pattern of the flash memory device. However, when the writing operation is done only in the cash, the data may be erased if power is turned off before the data is stored in the flash memory device. That is, the data maintenance that is a basic condition of the data storage system cannot be ensured. Therefore, although the reading performance is improved, the an ideal writing performance is not yet satisfied.

In the data storage system disclosed in US Patent Application No. 2004/0193782 A1, when a writing operation larger than the capacity of a MRAM used in the system is continuously requested, an overflow is generated in the MRAM and thus the following writing request is directly done in the flash memory device. This leads to a deterioration of the writing performance.

SUMMARY OF THE INVENTION

The present invention provides a data storage system with a complex memory that has an increased writing speed realized by managing only data which will be frequently updated in a writing buffer taking advantage of spatial locality and can reduce the number of writing and erasing operations for the flash memory that is an advantage obtained by using the buffer while reducing the size of the buffer.

The present invention also provides a method of operating the data storage system.

According to an aspect of the present invention, there is provided a data storage system including: a host unit; a storage unit; and a first input/output bus functioning as an interface between the host unit and the storage unit, wherein the storage unit includes a non-volatile memory buffer unit and a flash memory unit, the non-volatile memory unit including a plurality of buffers arranged in parallel, and the flash memory unit including a plurality of data storage devices arranged in parallel to input and output data using a parallel method.

The number of buffers included in the non-volatile memory buffer unit may be greater than the number of data storage devices included in the flash memory unit.

Each buffer may be a bank having a predetermined data storage capacity.

Each buffer may be a non-volatile memory chip.

Each data storage device may be a bank, and each bank may include a plurality of pages each having a predetermined data storage capacity.

Each data storage device may be a flash memory chip.

A data storage capacity of each buffer may be equal to, or N (N=1, 2, 3) times, that of each page.

A data storage capacity of each buffer may be equal to, or N (N=1, 2, 3) times, a block size that is a deleting unit of the flash memory.

According to another aspect of the present invention, there is provided a method of writing data in a data storage system including a host unit, a storage unit and a first input/output bus functioning as an interface between the host unit and the storage unit, wherein the storage unit includes a non-volatile memory buffer unit and a flash memory unit, the non-volatile memory unit includes a plurality of buffers arranged in parallel and the flash memory unit including a plurality of data storage devices arranged in parallel, the method including: writing data in a first buffer of the plurality of buffers; writing data in a second buffer of the plurality of buffers; writing data in a third buffer of the plurality of the buffers; writing the data written in the first buffer in a first page of a first data storage device of the plurality of data storage devices; and writing the data written in the second buffer in a first page of a second data storage device of the plurality of the data storage devices, wherein the writing of the data in the second buffer and the writing of the data written in the first buffer in the first page are simultaneously performed and the writing of the data in the third buffer and the writing of the data written in the second buffer in the first page are simultaneously performed.

The method may further comprise writing the data written in the third buffer in a second page of the first data storage device of the plurality of data storage devices, wherein new data are written in the first buffer during the writing of the data written in the third buffer in a second page of the first data storage device of the plurality of data storage devices. The method may further comprise deleting the data written in the first buffer before the new data is written in the first buffer.

The number of buffers included in the non-volatile memory unit may be greater than the number of data storage devices included in the flash memory unit. Each buffer may be a bank having a predetermined storage capacity.

According to still another aspect of the present invention, there is provided a method of writing data in a data storage system including a host unit, a storage unit and a first input/output bus functioning as an interface between the host unit and the storage unit, wherein the storage unit includes a non-volatile memory buffer unit and a flash memory unit, the non-volatile memory unit including a plurality of buffers arranged in parallel, and the flash memory unit including a plurality of data storage devices arranged in parallel, the method including: writing data written in a first page of a first data storage device of the plurality of data storage devices in a first buffer of the plurality of buffers; writing data written in a first page of a second data storage device of the plurality of data storage devices in a second buffer of the plurality of buffers; writing data written in a second page of the first data storage device of the plurality of data storage devices in a third buffer of the plurality of buffers; wherein the writing of the data written in the first page of the second data storage device starts after the writing of the data written in the first page of the first data storage starts and ends after the writing of the data written in the first page of the first data storage device ends and the writing of the data written in the second page of the first storage device starts after the writing of the data written in the first page of the first data storage device ends; and while the writing of the data written in the first page of the second data storage device in the second buffer is performed, the data written in the first buffer is read and while the writing of the data written in the second page of the first data storage device in the third buffer is performed, the data written in the second buffer is read.

The method may further include writing data written in a second page of a second data storage device in the first buffer after the data written in the first buffer is read and before the writing of the data written in the second page of the first data storage device in the third buffer ends.

According to still yet another aspect of the present invention, there is provided a method of storing data in a data storage system having a flash memory unit and a writing buffer unit, the method including: classifying a writing request into one of a plurality of grades according to a writing request frequency when a writing request is made; and storing the writing requested data in one of the memory unit and the writing buffer unit according to the writing request frequency.

In the method, the storing of the writing requested data may comprise storing a page having a relatively high writing request frequency in the writing buffer unit, and, when the writing buffer unit is full, storing one of the pages stored in the writing buffer unit in the flash memory unit.

When the writing request is classified into one of two grades, the data having a relatively high writing request frequency may be stored in the writing buffer unit and the data having a relatively low writing request frequency are stored in the flash memory unit.

Alternatively, when the writing request is classified into one of two grades, the storing of the writing requested data may include: temporarily storing data having a relatively high writing request frequency in a first writing buffer of the plurality of writing buffers; temporarily storing data having a relatively low writing request frequency in a second writing buffer of the plurality of writing buffers or the flash memory unit.

Alternatively, when the writing request is classified into one of three grades, the storing of the writing requested data may include: temporarily storing data having a relatively high writing request frequency in a first writing buffer of the plurality of writing buffers; temporarily storing data having a middle writing request frequency in a second writing buffer of the plurality of writing buffers; and storing data having a relatively low writing request frequency in the flash memory unit.

Alternatively, when the writing request is classified into one of three grades, the storing of the writing requested data includes: temporarily storing data having a relatively high writing request frequency in a first writing buffer of the plurality of writing buffers; temporarily storing data having a middle writing request frequency in a second writing buffer of the plurality of writing buffers; and temporarily storing data having a relatively low writing request frequency in a third writing buffer of the plurality of writing buffers.

When there is a page for the writing request available in the writing buffer unit, the page of the writing buffer unit may be updated to the available page in the writing buffer unit regardless of the classification of the writing request.

The classifying of the writing request may include classifying the writing request as a hot or cold pages using one or more LRU (Least Recently Used) Q.

Alternatively, the classifying of the writing request may include adding a count value to the writing request and classifying the writing request according to whether the count value is reduced to a predetermined value after a predetermined time has lapsed.

When the data having the relatively high writing request frequency is to be written in the writing buffer unit and the writing buffer unit is full, data stored in the writing buffer unit and having a relatively low using frequency may be stored in the flash memory, after which the data having the relatively high writing request frequency is stored in the writing buffer unit.

After the data having the relatively high writing request frequency is stored in the writing buffer unit, metadata may be updated.

According to still yet another aspect of the present invention, there is provided a data storage system including: a memory unit having a flash memory unit and a writing buffer unit; and a memory control unit including a page classification unit for classifying a writing request into one of a plurality of grades according to a writing request frequency when a writing request is made, wherein the memory control unit stores the writing requested data in one of the memory unit and the writing buffer unit according to the writing request frequency.

When the writing request is classified into one of two grades, the memory control unit may store data having a relatively high writing request frequency in the writing buffer unit and store data having a relatively low writing request frequency in the flash memory unit.

The writing buffer unit may include a plurality of writing buffers arranged in parallel.

Alternatively, when the writing request is classified into one of two grades, the memory control unit may temporarily store data having a relatively high writing request frequency in a first writing buffer of the plurality of writing buffers, temporarily store data having a relatively low writing request frequency in a second writing buffer of the plurality of writing buffers or in the flash memory unit.

Alternatively, when the writing request is classified into one of three grades, the memory control unit may temporarily store data having a relatively high writing request frequency in a first writing buffer of the plurality of writing buffers, temporarily store data having a middle writing request frequency in a second writing buffer of the plurality of writing buffers, and store data having a relatively low writing request frequency in the flash memory unit.

Alternatively, when the writing request is classified into one of three grades, the memory control unit may temporarily store data having a relatively high writing request frequency in a first writing buffer of the plurality of writing buffers, temporarily store data having a middle writing request frequency in a second writing buffer of the plurality of writing buffers, and temporarily store data having a relatively low writing request frequency in a third writing buffer of the plurality of writing buffers.

In the above-described systems and methods, the buffer may be one of a bank and a non-volatile memory chip having a predetermined data storage capacity. The first and second data storage devices may be first and second banks, respectively, and each of the first and second banks may include a plurality of pages each having a predetermined data storage capacity. The first and second data storage devices may be first and second flash memory chips, respectively.

The data storage capacity of the buffer may be equal to, or N (N=1, 2, 3) times, that of the page. The data storage capacity of the buffer may be equal to, or N (N=1, 2, 3) times, a block size that is a deleting unit of the flash memory.

The non-volatile memory unit and the flash memory unit may be formed in a single chip.

The storage unit may further include a flash translation layer and a second input/output bus functioning as an interface between the non-volatile memory buffer unit and the flash memory unit.

The storage unit may be provided in the form of a card that can be detachably installed on the host unit.

The host unit may further include a first file system, a second file system, a flash translation layer interfacing with the first file system, and a device driver interfacing with the second file system.

The non-volatile memory chip may be selected from the group consisting of an MRAM, a PRAM, an FRAM, a non-volatile polymer memory chip, and a combination thereof.

The writing buffer unit may be a battery attached type non-volatile memory.

The writing buffer unit may be a volatile memory.

The flash memory unit may include a NAND-type Single Level Cell (SLC) flash memory and a NAND-type Multi Level Cell (MLC) flash memory.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown.

Figure 1:
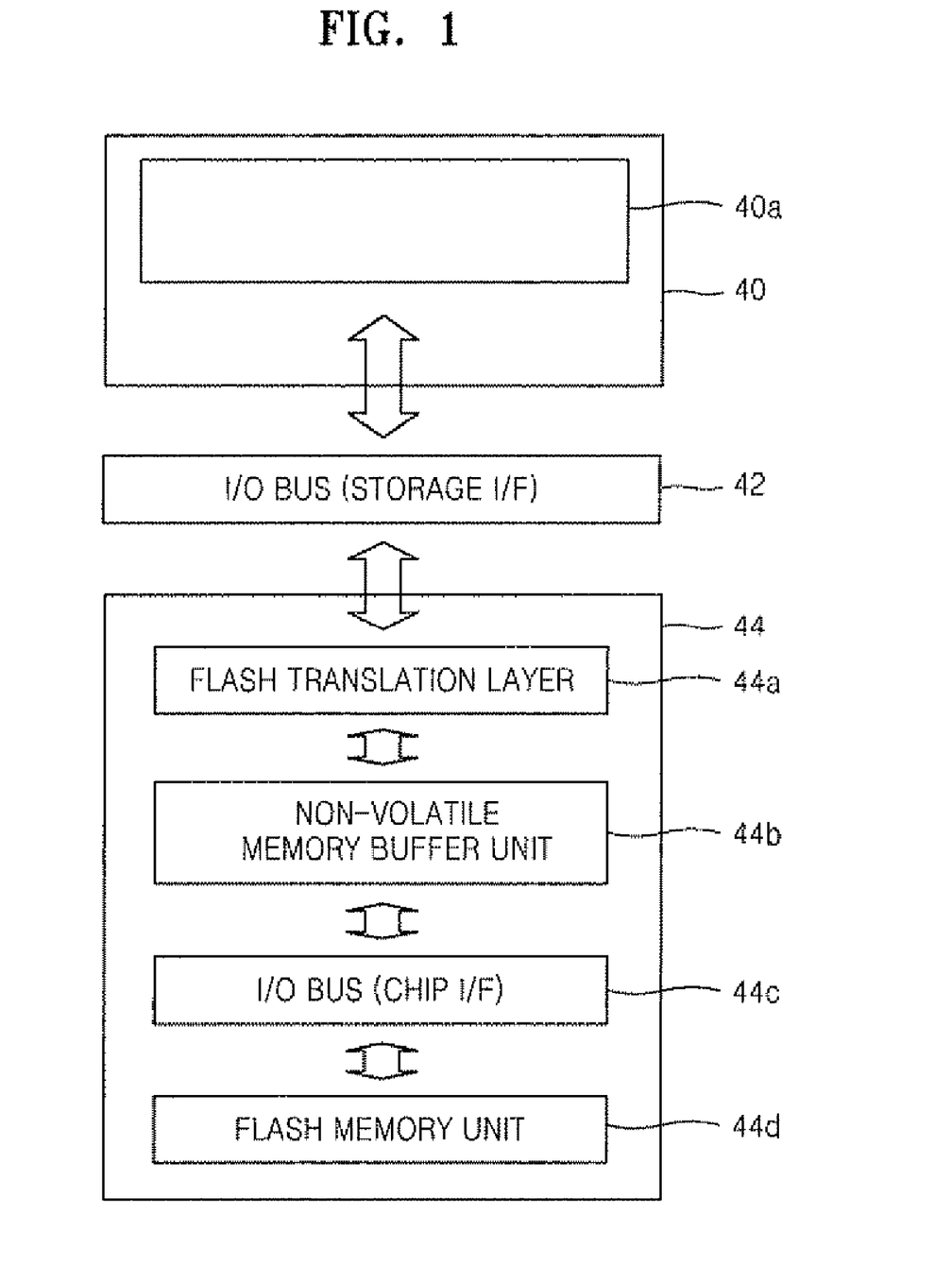
FIG. 1 is a block diagram of a data storage system having a complex memory according to an embodiment of the present invention.

FIG. 1 is a block diagram of a data storage system (hereinafter, referred as "first system") having a complex memory according to an embodiment of the present invention.

Referring to FIG. 1, the first system includes a host unit 40, a storage unit 44 and a first I/O (input/output) bus 42. The first I/O bus 42 functions as an interface between the host unit 40 and the storage unit 44. The host unit 40 is a computer main body in which a file system 40a is equipped. The storage unit 44 includes a flash translation layer 44a, a non-volatile buffer unit 44b, a second I/O bus 44c, and a flash memory unit 44d. The flash translation layer 44a is provided in the form of hardware, which can identify data and a location where the data is recorded in the flash memory 44d, perform the erasing operation, and identify data and a location where the data is recorded in the non-volatile memory buffer unit 44b. Accordingly, the data recorded in the flash memory buffer unit 44b can be read using the flash translation layer 44a. The second I/O bus 44c functions as an interface between the non-volatile memory buffer unit 44b and the flash memory unit 44d. The storage unit 44 is portable and can be detachably attached on the host unit 40. For example, the storage unit 44 may be any one of a compact flash card, a smart media card, a multimedia card, a secure digital card, a memory stick card, and a Universal Serial Bus (USB) storage device.

Figure 2:
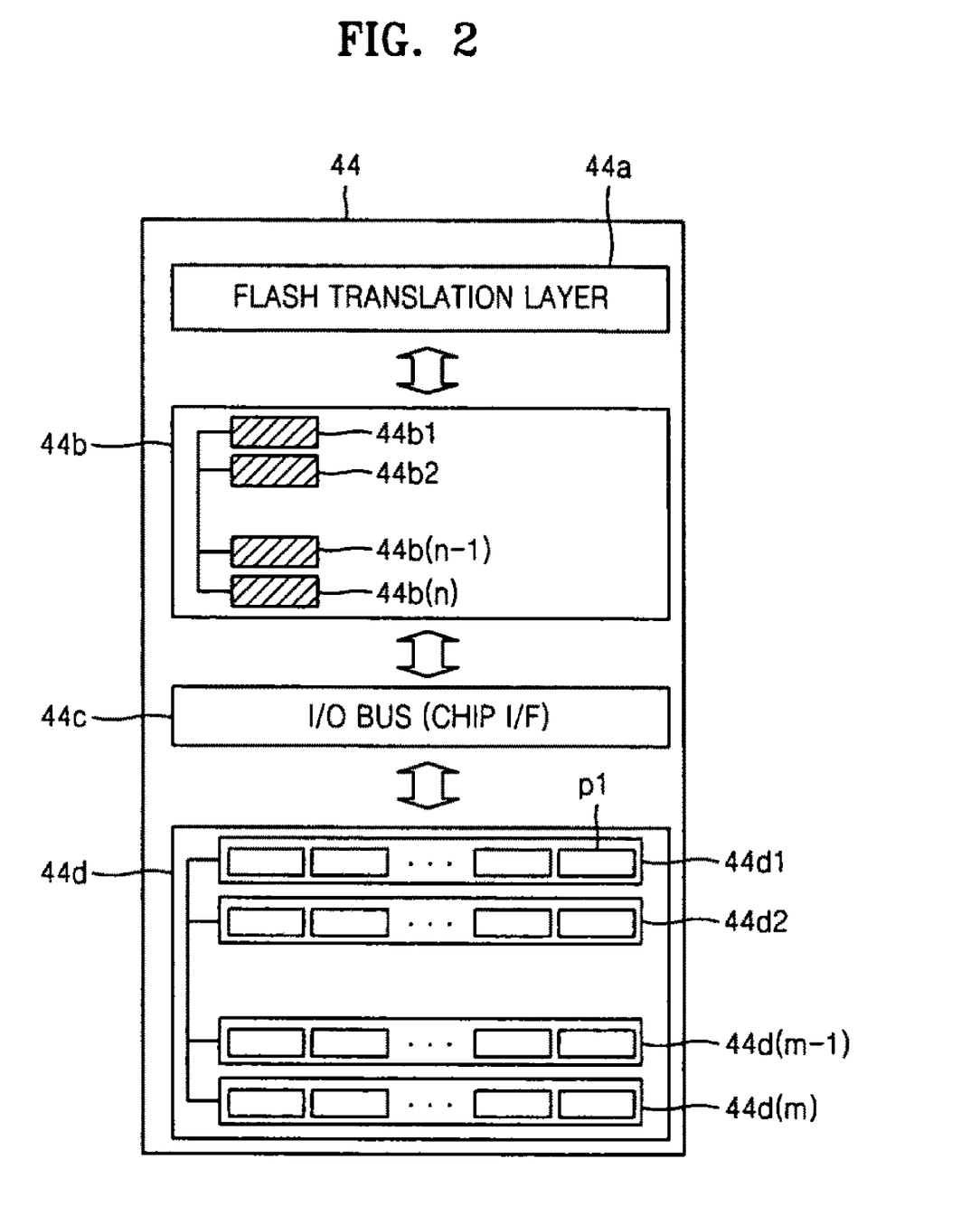
FIG. 2 is a block diagram of a storage unit of FIG. 1 according to an embodiment of the present invention.

FIG. 2 is a block diagram of a storage unit of FIG. 1 according to an embodiment of the present invention. Referring to FIG. 2, the non-volatile memory buffer unit 44b includes first through nth non-volatile memory buffers (hereinafter, referred as "buffers") 44b1, 44b2 . . . 44b(n−1), 44b(n). The first through nth buffers 44b1, 44b2 . . . 44b(n−1), and 44b(n) are connected in parallel. The first through nth buffers 44b1, 44b2 . . . 44b(n−1), and 44b(n) may be banks or chips each having a predetermined capacity. The banks or chips are MRAMs, FRAMs, PRAMs or non-volatile polymer memories. The flash memory unit 44d may include first through mth banks 44d1, 44d2 . . . 44d(m−1), and 44d(m). Each of the first through mth banks 44d1, 44d2 . . . 44d(m−1), and 44b(m) includes a plurality of pages p1. Each page p1 has a predetermined capacity, which is preferably the same as that of each of the first through nth buffers 44b1, 44b2 . . . 44b(n−1), 44b(n) of the non-volatile memory buffer unit 44b. That is, a capacity of one of the buffers forming the non-volatile memory buffer unit 44b is identical to that of one of the pages p1 forming each of the first to mth banks 44d1, 44d2 . . . 44d(m−1), and 44d(m). For example, when the capacity of each buffer of the non-volatile memory buffer unit 44b is 512 bytes, the capacity of one page p1 which forms each of the first through mth banks 44d1, 44d2 . . . 44d(m−1), and 44d(m) is also 512 bytes. Each of the first to mth banks 44d1, 44d2 . . . 44d(m−1), and 44d(m) may be formed using individual flash memory chips. The flash memory unit 44d may include a NAND-type Single Level Cell (SLC) flash memory and a NAND-type Multi Level Cell (MLC) flash memory. At this point, each of the flash memories includes a plurality of banks that are connected in parallel.

Although it is preferable that the capacity of each buffer of the non-volatile memory buffer unit 44b is same as that of each page p1 of the banks of the flash memory unit 44d, the capacity of the buffer may be n (where n=1, 2, 3) times larger or smaller than the capacity of the page. Alternatively, the capacity of the buffer may be identical to or n times (n=1, 2, 3) the size of the block that is an erasing unit of the flash memory.

Meanwhile, in the nth buffer 44b(n), the number "n" of the buffers (or banks) contained in the non-volatile memory buffer unit 44b may be 2p+1 where the p represents a degree of the parallelism of the flash memory devices of the flash memory unit 44d. The degree of the parallelism is a natural number that is identical to or less than a value obtained by dividing the writing speed of a flash memory device by the writing speed of a non-volatile memory device. For example, when the first through nth buffers 44b1, 44b2 . . . 44b(n−1), 44b(n) are FRAM devices and the first through mth banks 44d1, 44d2 . . . 44d(m−1), and 44d(m) of the flash memory unit 44d are NAND-type flash memory devices, the writing speed of the FRAM devices is 100 ns/word and the writing speed of the NAND-type flash memory devices is 500 ns/word. Therefore, the degree "p" of the parallelism of the flash memory devices of the flash memory unit 44d in relation to the FRAM devices is 5. In this case, the non-volatile memory buffer unit 44b includes 11(2×5+1) buffers (or banks) and the flash memory unit 44d includes 5 logical I/O banks.

Figure 3:
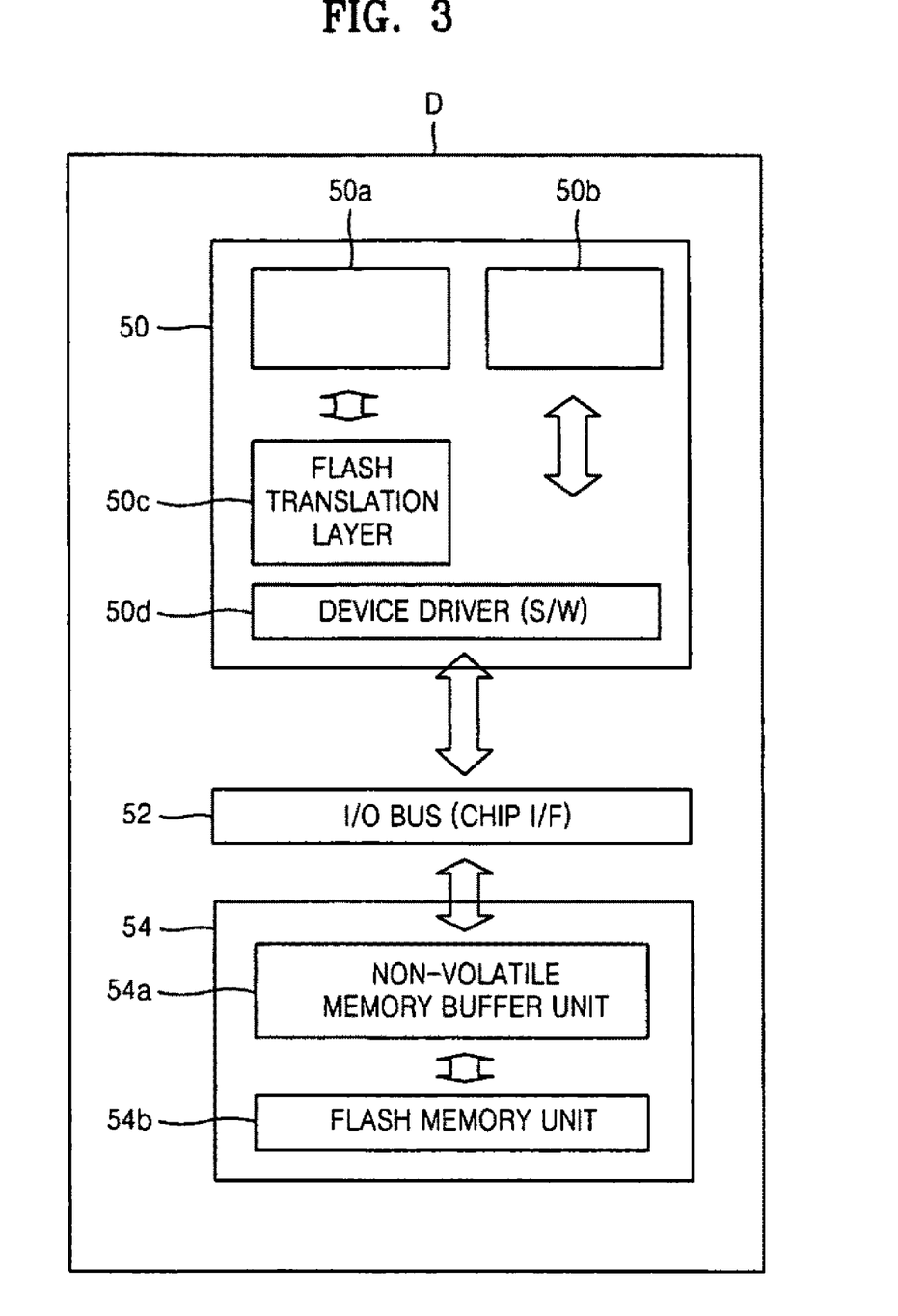
FIG. 3 is a block diagram of a data storage system with a complex memory according to another embodiment of the present invention.

FIG. 3 is a block diagram of a data storage system (hereinafter, referred to as "second system") having a parallel I/O complex memory according to another embodiment of the present invention.

Referring to FIG. 3, the second system D includes a host unit 50, a storage unit 54 and an I/O bus 52. The host unit 50, I/O bus 52 and storage unit 54 are equipped in a single main body. That is, while the storage unit 44 of the first system is a portable device such as a diskette that can be detachably attached to the host unit 40, the storage unit 54 and the host unit 50 of the second system may be chips that are mounted on a single board. The host unit 50 includes a file system 50a and an additional file system 50b. The host unit 50 further includes a flash translation layer 50c associated with the operation of the file system 50a and a device driver 50d associated with the operation of the additional file system 50b. The device driver 50d is provided in the form of software. In the second system D, the I/O bus 52 functions as an interface between the host unit 50 and the storage unit 54. The storage unit 54 includes a non-volatile memory unit 54a and a flash memory unit 54b. The flash memory unit 54b may include a NAND-type SLC flash memory and a NAND-type MLC flash memory.

Figure 4:
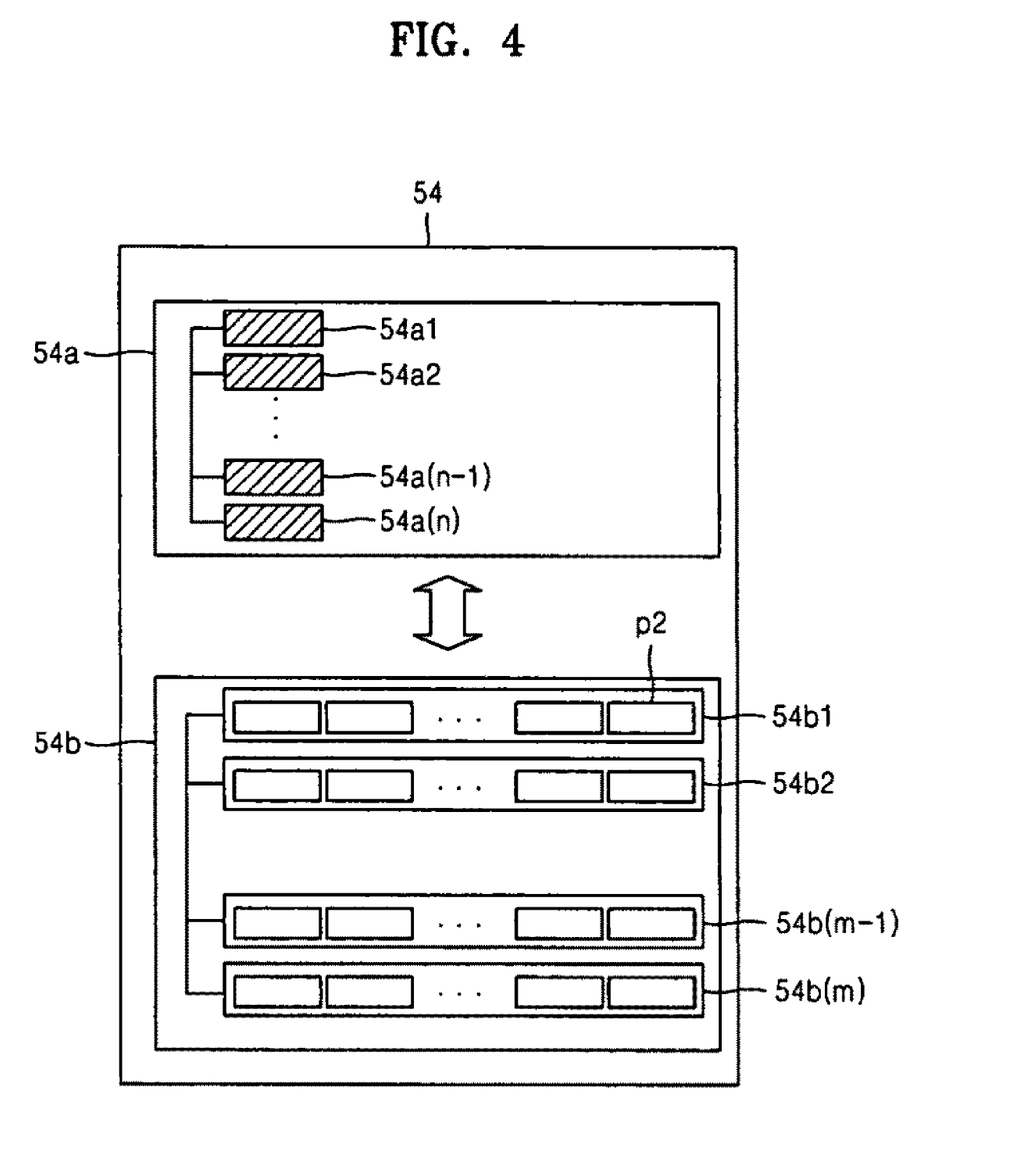
FIG. 4 is a block diagram of a storage unit of FIG. 3 according to an embodiment of the present invention.

FIG. 4 is a diagram showing the storage unit 54 of the second system D of FIG. 3 in more detail according to an embodiment of the present invention.

Referring to FIG. 4, the non-volatile memory buffer unit 54a includes first through nth non-volatile memory buffers (hereinafter, referred as "buffers") 54a1, 54a2 . . . 54a(n−1), 54a(n). The flash memory unit 54b may include first through mth banks 54b1, 54b2 . . . 54b(m−1), and 54b(m). The buffers 54a1, 54a2 . . . 54a(n−1), 54a(n) are arranged in parallel and the banks 54b1, 54b2 . . . 54b(m−1), and 54b(m) are also arranged in parallel. The parallel arrangements of the buffers and banks means that their structures are parallel and the operations thereof are performed in parallel. In this way, data can be recorded in the buffers and banks in parallel. The buffers 54a1, 54a2 . . . 54a(n−1), 54a(n) may be identical to those of the first system. Each of the banks 54b1, 54b2 . . . 54b(m−1), and 54b(m) includes a plurality of pages p2. Therefore, the banks 54b1, 54b2 . . . 54b(m−1), and 54b(m) may be identical to those of the first system. The banks 54b1, 54b2 . . . 54b(m−1), and 54b(m) may be formed using a single chip. Alternatively, each of the banks 54b1, 54b2 . . . 54b(m−1), and 54b(m) may be formed using individual flash memory chips.

Meanwhile, each of the flash memory units 44d and 54d of the first and second systems includes a NAND-type flash memory or a NOR-type flash memory. When the NOR-type flash memory is applied, data is input or output in units of bytes or words. In this case, it is difficult to manage the data.

Therefore, in the present invention, even when the flash memory is the NOR-type, the pages of the banks of each of the flash memory units 44d and 54d may be logical pages conceptually identical to the case when the flash memory is the NAND-type. In addition, when the NOR-type flash memory is applied to the flash memory units 44d and 54b, the size of each page of the banks may be identical to or different from that of the page of the banks when the NAND-type flash memory is applied.

When the NOR-type flash memory is applied and the pages of the banks are identical to that of the banks when the NAND-type flash memory is applied, the operation of the flash memory units 44d and 54b is identical to that when the NAND-type flash memory is applied, as will be described later.

Writing processes of the first and second systems will now be described with reference to FIG. 5.

Figure 5:
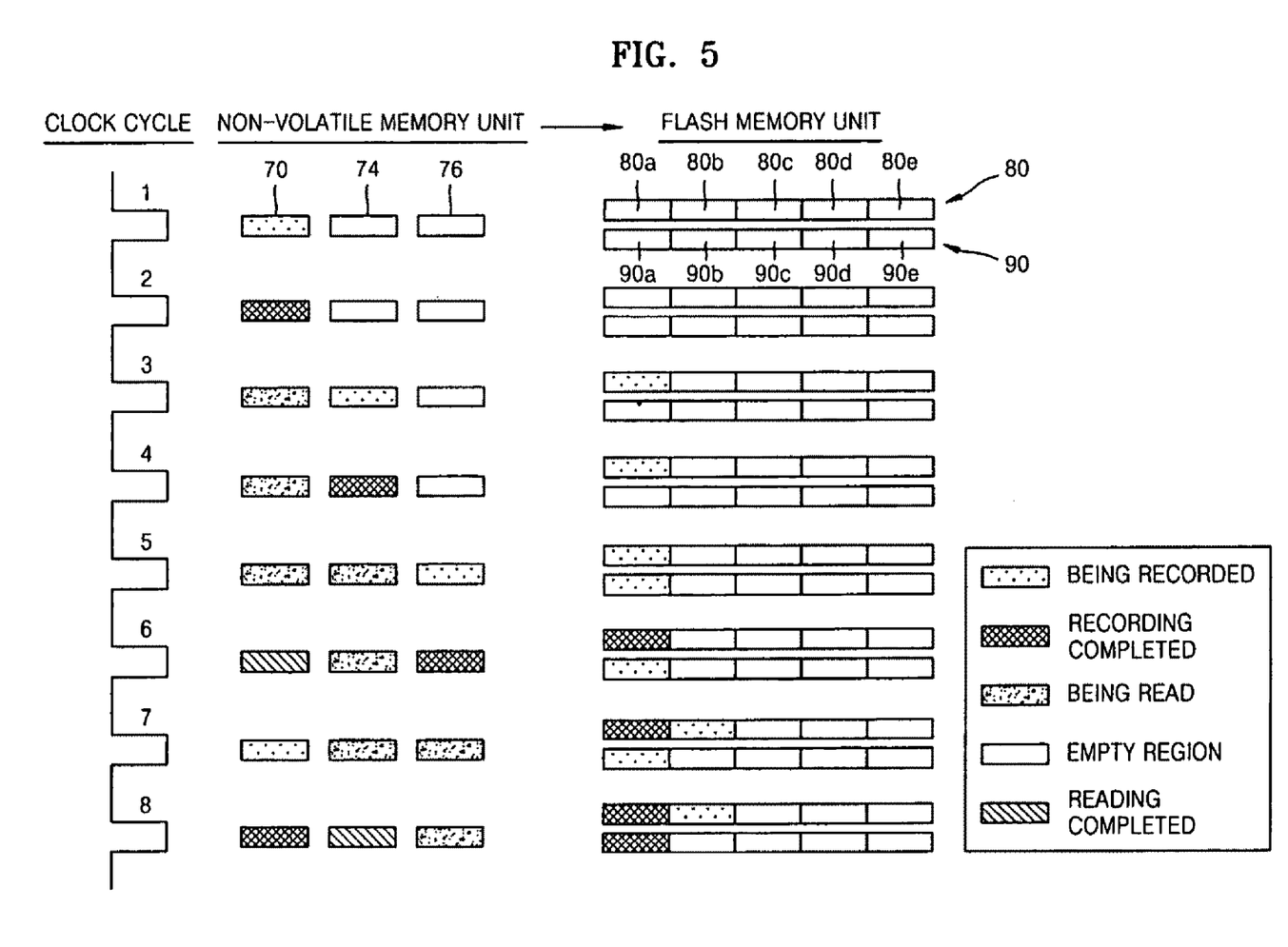
FIG. 5 is a block diagram illustrating a writing process in the data storage system of FIG. 1 or 3 in reference to an applied clock cycle according to an embodiment of the present invention.

In FIG. 5, the arrow indicates a dataflow direction from the non-volatile memory buffer unit to the flash memory unit. That is, the data written in the non-volatile memory buffer unit is moved to the flash memory unit.

Figure 6:
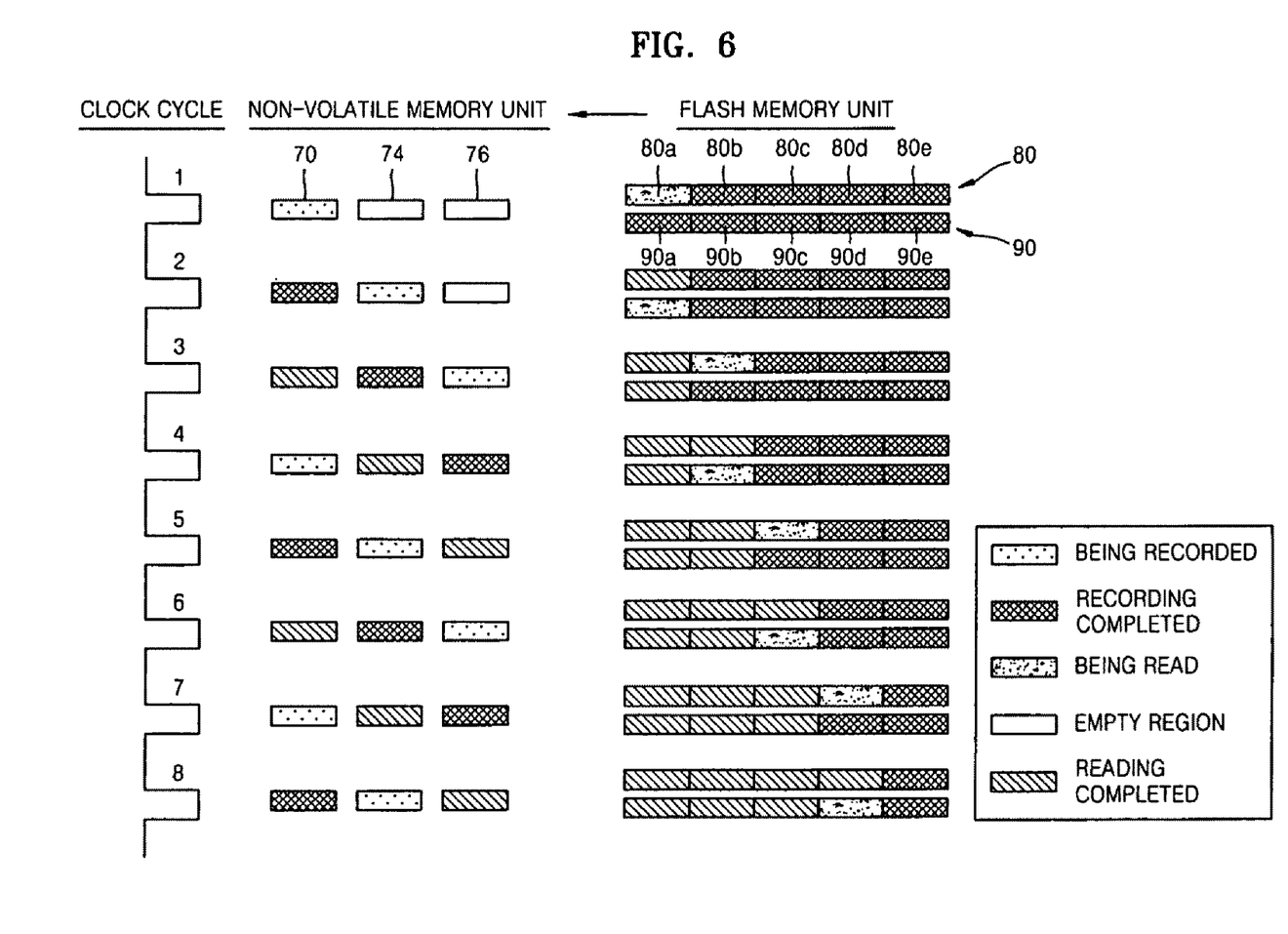
FIG. 6 is a block diagram illustrating a reading process in the data storage system of FIG. 1 or 3 in reference to an applied clock cycle according to an embodiment of the present invention.

In FIGS. 5 and 6, it is assumed that one clock signal and two clock signals are utilized for the reading and writing operations, respectively, of the non-volatile memory and two clocks and four clocks are utilized for the reading and writing operations, respectively, of the flash memory. The reading/writing speeds depend on the types of the non-volatile memory and the flash memory. The relative ratio between the reading/writing performance of the non-volatile memory and the reading/writing performance of the flash memory becomes a design factor in determining the number of buffers of the non-volatile memory and the number of banks of the flash memory to be utilized.

In FIG. 5, an example is given for convenience showing that the non-volatile memory buffer unit includes first to third buffers 70, 74 and 76 that are arranged in parallel and the flash memory unit includes first and second banks 80 and 90. At this point, the first bank 80 includes first through fifth pages 80a, 80b, 80c, 80d, and 80e. The second bank 90 includes first through fifth pages 90a, 90b, 90c, 90d, and 90e. The first through third buffers 70, 74 and 76 may be some of the buffers contained in the non-volatile memory buffer units 44b and 54a as shown in FIGS. 2 and 4, respectively. The first and second banks 80 and 90 may be some of the banks contained in the flash memory units 44d and 54b as shown in FIGS. 2 and 4, respectively.

Referring to FIG. 5, data is recorded in the first buffer 70 of the non-volatile buffer unit at a first clock pulse 1. The recording of the data in the first buffer 70 is continued until a second clock pulse 2. After the recording of the data in the first buffer 70 is finished, the data recorded in the first buffer 70 starts being recorded in the first page 80a of the first bank 80 at a third clock pulse 3. The process for recording the data recorded in the first buffer 70 in the first page 80a of the first bank 80 is continued until a sixth clock pulse. The time spent in recording the data recorded in the first buffer 70 in the first page 80a of the first bank 80 is two times that spent in recording the data in one of the buffers of the non-volatile memory buffer unit. Therefore, while the data recorded in the first buffer 70 is recorded in the first page 80a of the first bank 80, further data cannot be recorded in the first buffer 70. Therefore, while the data recorded in the first buffer 70 is recorded in the first page 80a of the first bank 80, further data input to the non-volatile memory buffer unit is consecutively recorded in the second and third buffers 74 and 76. The point of time when data is recorded in the second and third buffers 74 and 76 depends on whether the data input to the non-volatile buffer unit is continuous or discontinuous. For example, if there is no data input to the non-volatile memory buffer unit until the data recorded in the first buffer 70 moves completely to the first page 80a of the first bank 80, the following data input to the non-volatile memory buffer unit can be recorded again in the first buffer 70. On the other hand, if data is continuously input, further input data is recorded in the second buffer 74 after initial data is first input to the first buffer 70. That is, the recording of data to the second buffer 74 starts at the third clock pulse 3 and ends at a fourth clock pulse 4. The recording of the data recorded in the first buffer 70 to the first page 80a of the first bank 80 is continued at the fourth clock pulse 4 where the recording of the data to the second buffer 74 is completed. After recording of the data to the second buffer 74 is completed, the data recorded in the second buffer 74 starts being recorded in the first page 90a of the second bank 90. A process for recording the data recorded in the second buffer 74 in the first page 90a of the second bank 90 starts at the fifth clock pulse 5 and continues until an eighth clock pulse 8. A process for recording the data recorded in the first buffer 70 in the first page 80a of the first bank 80 starts at the third clock pulse 3 and continues until the sixth clock pulse 6. Therefore, during the fifth and sixth clock pulses 5 and 6, recording of the data to the first and second buffers 70 and 74 cannot be done. Recording of the data to the second buffer 74 cannot be done until the eighth clock pulse 8. Therefore, after the data is recorded in the second buffer 74, data input to the non-volatile memory buffer is recorded in the third buffer 76 at the fifth clock pulse 5. Recording of the data in the third buffer 76 continues until the sixth clock pulse 6. At the sixth clock pulse 6, the recording of the data to the third buffer 76 is completed and the data recorded in the first buffer 70 is recorded in the first page 80a of the first bank 80. However, the data recorded to the second buffer 74 is continuously recorded in the first page 90a of the second bank 90. As described above, at the sixth clock pulse 6 the recording of data to the third buffer 76 is completed and the first buffer 70 of the non-volatile memory buffer unit is empty. Therefore, further data being input to the non-volatile memory buffer unit at the seventh clock pulse 7 can be recorded to the first buffer 70.

The reading operation of the first or second system will now be described.

The reading operation of the first or second system is similar to a conventional data cashing method. That is, an address region that is frequently used is maintained in a part of the non-volatile RAM using the hardware cash or the LRU (Least Recently Used) software. When there is a reading request for the data remained in the non-volatile RAM, the data is quickly read from the non-volatile RAM without using the flash memory and transmitted. According to a feature of the present invention, a prefetching method is additionally utilized for the reading operation. In this case, the stored data is quickly read from the selected bank of the flash memory using the parallel structure and the prefetching of the data is done from the selected buffer of the non-volatile memory buffer unit.

In the above-described reading method, as in the writing operation, using the degree of the parallelism corresponding to the relative ratio of the reading performance between of the non-volatile RAM and the flash memory utilized, data that is expected to be read is first loaded on the selected buffer of the non-volatile memory buffer unit and data that is already read is pushed out.

When the estimation of data that is expected to be read is accurate, the reading speed may be identical to a case where data is read from the non-volatile RAM even when a buffer having a relatively small capacity is used.

FIG. 6 shows the reading process of the first or second system in reference to an applied clock cycle. In FIG. 6, the arrow indicates a dataflow direction.

Referring to FIG. 6, data recorded in the first page 80a of the first bank 80 of the flash memory unit is read and recorded in the first buffer 70 of the non-volatile memory buffer unit (hereinafter, "first recording"). At this point, the bank 80 may be one of the banks contained in the SLC flash memory of the flash memory unit or one of the banks contained in the MLC flash memory of the flash memory unit. Since reading speed of the flash memory unit is faster than writing speed of the flash memory unit, the first recording starts at the first clock pulse 1 and continues until the second clock pulse 2. While the first recording is being performed, the data recorded in the first page 90a of the second bank 90 are read and recorded in the second buffer 74 of the second non-volatile memory buffer unit (hereinafter, "second recording"). The second recording starts one clock pulse after the first recording starts. That is, the second recording starts at the second clock pulse 2 and continues until the third clock pulse 3. While the second recording is being performed, data recorded in the second page 80b of the first bank 80 is read and recorded in the third buffer 76 (hereinafter, "third recording"). The third recording starts at the third clock pulse 3 and continues until the fourth clock pulse 4.

The recording of data in the first and third buffers 70, 74 and 76 of the non-volatile buffer unit from the flash memory unit through the first through third recording processes can be successively read. That is, the data recorded in the first buffer 70 is read right after the data recorded in the first page 80a of the first bank 80 is written in the first buffer 70. That is, the data transferred from the first page 80a of the first bank 80 to the first buffer 70 during the first recording is read until the third clock pulse 3. When the third clock pulse 3 appears, the second recording where the data recorded in the first page 90a of the second bank 90 is recorded in the second buffer 74 is completed. Therefore, right after the data recorded in the first buffer 70 is read until the third clock pulse 3, the data recorded in the second buffer 74 can be read at the fourth clock pulse 4. Likewise, the data recorded in the second buffer 74 is read at the fourth clock pulse 4, the data recorded in the third buffer 76 can be read at the fifth clock pulse 5.

Figure 7:
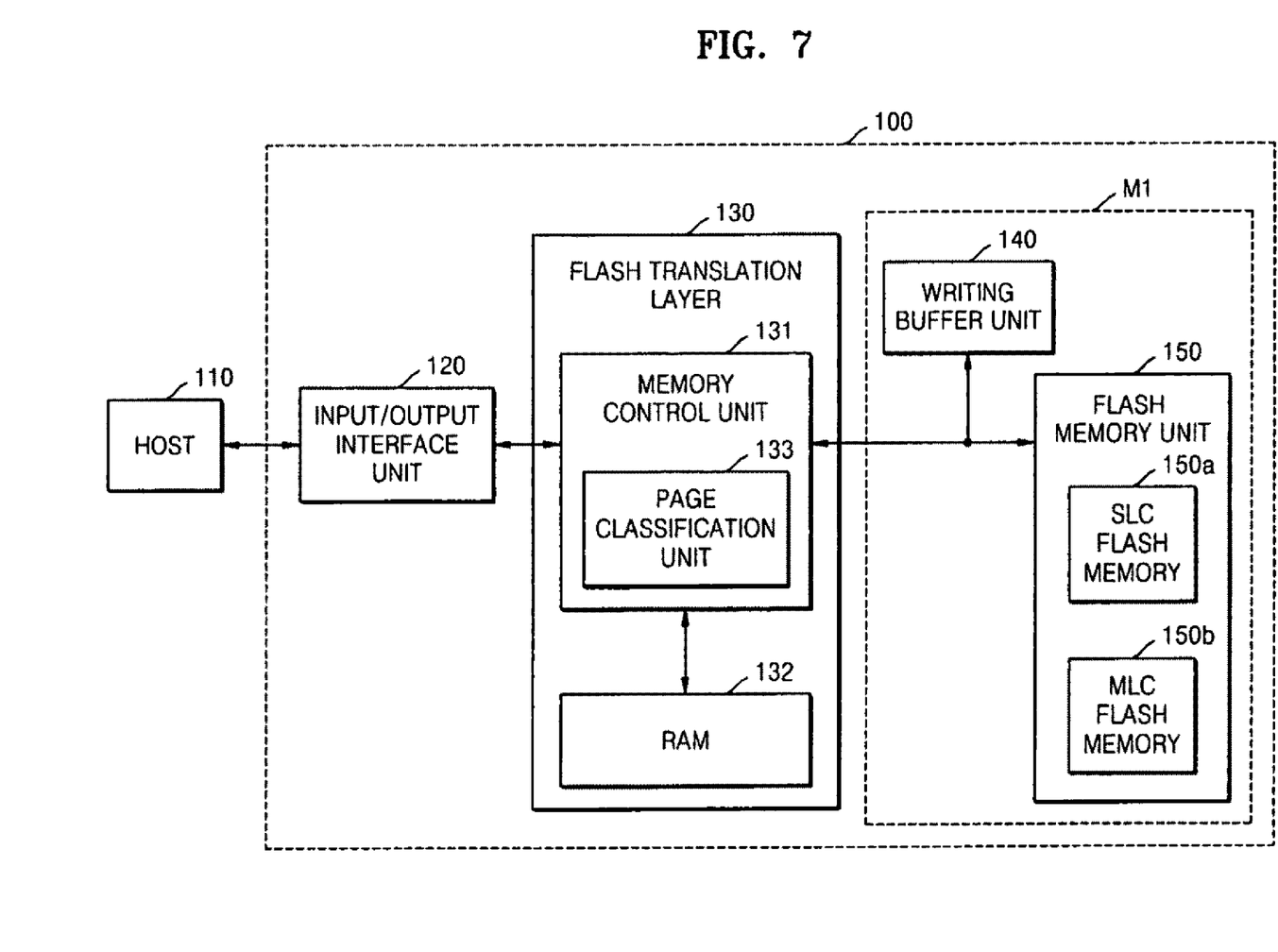
FIG. 7 is a block diagram illustrating a data storage system with a complex memory according to another embodiment of the present invention.

FIG. 7 shows a block diagram of a data storage system (hereinafter, "third system") with a complex memory according to another embodiment of the present invention.

Referring to FIG. 7, the third system includes a data storage unit 100 and a host 110. The data storage unit 100 includes an I/O interface unit 120, a flash translation layer 130, and a memory unit M1. The memory unit M1 includes a writing buffer unit 140 and a flash memory 150. The data storage unit 100 is portable and can be detachably attached on the host 110. For example, the data storage unit 100 may be any one of a compact flash card, a smart media card, a multimedia card, a secure digital card, a memory stick card, and a USB storage device. The host 110 controls the flash memory unit 150 through a memory control unit 131 of the flash translation layer 130. The host 110 transfers a logical address designating a location in which data of the flash memory will be recorded to the memory flash translation layer 130. The host 100 may be a personal computer, a digital camera, or other portable electronic devices such as an MP3 player.

The I/O interface unit 120 functions as an interface between the host 110 and the data storage unit 100 for data exchange between each functional part of the data storage unit 100 and the host 110. The I/O interface unit 120 transfers the logical address designating a read target page to the flash translation layer 130 by decoding a flash memory reading order transferred from the host 110. In addition, the I/O interface unit 120 transfers read target data, which is transferred from the flash memory unit 150 by the memory control unit 131, to the host 110 through an external bus. The I/O interface unit 120 transfers the logical address designating a write target page to the flash translation layer 130 by decoding a flash memory writing order transferred from the host 110.

The flash translation layer 130 functions to allow the flash memory unit 150 to be used as a block device such as a hard disk. The flash translation layer 130 functions to translate the logical address into the physical address using mapping information when there is a writing/reading operation request for at the logical address while maintaining the mapping information between the logical address on the imaginary block device and the physical address on the flash memory. Particularly, when there is a writing operation request for translating data of a logical address, the flash translation layer 130 functions to electrically delete and rerecord the physical address corresponding to the logical address or to remap the logical address into another physical address. The flash translation layer 130 may include a memory control unit 131 and a RAM 132. The memory control unit 131 may include a page classification unit 133 for classifying a writing request into one of a plurality of grades. The memory control unit 131 stores a logical address for the writing request received through the I/O interface unit 110. When the writing request is received through the I/O interface unit 110, the page classification unit 133 classifies the writing request into one of the plurality of grades according to a writing request frequency. The page classification unit 133 may classify the writing request into two or three grades, as will be described in more detail.

The memory control unit 131 stores data requested to be written in the writing buffer unit 140 or the flash memory unit 150 according to a grades classified by the page classification unit 133. If the writing request can be classified into one of two grades, the memory control unit 131 temporarily stores the data having a grade of a high writing request frequency in the writing buffer unit 140 and stores the data having a grade of a low writing request frequency in the flash memory 150.

The data received through the I/O interface unit 120 is temporarily stored in the writing buffer unit 140 in a unit of a page by the control of the memory control unit 131. The writing buffer unit 140 may be a non-volatile memory selected from the group consisting of an MRAM, an FRAM, a PRAM, a polymer memory, and a combination thereof. In addition, the writing buffer unit 140 may be a battery attached type non-volatile memory. Alternatively, the writing buffer unit 140 may be a volatile memory. The writing buffer unit 140 may be formed of a plurality of banks or chips that are arranged in parallel.

The flash memory unit 150 is divided into a plurality of physical blocks each having a predetermined size. The physical blocks have their own physical block number (0, 1, 2 . . . n−1). Therefore, they can be individually designated and used as a deleting unit. In addition, each of the physical blocks is divided into a plurality of physical pages each having a predetermined size. Each of the physical pages can be accessed as an offset of a corresponding physical block and used as a reading/writing unit. The physical block and the physical page may be set to have various sizes according to the size of the NAND-type flash memory. For example, when an overall capacity, block size and page size of the flash memory unit 150 are 128 Mbytes, 16 Kbytes, and 512 Bytes, respectively, each physical block of the flash memory comprises 32 physical pages. The flash memory unit 150 may include a NAND-type SLC flash memory 150a and a NAND-type MLC flash memory 150b. At this point, each of the flash memories 150a and 150b has a plurality of physical blocks.

A process for storing data in the third system will now be described.

The present invention is based on a fact that the number of writing operations and the buffer size can be reduced by using a temporal locality appearing in the writing operation.

There is a temporal-spatial locality in a memory accessing pattern of a computer system. Likewise, there is also the temporal-spatial locality in the I/O pattern of the storage system. At this point, the temporal locality means that data that has been more recently accessed is more likely to be accessed again. The spatial locality means that a block, file, or directory that is adjacent to a block, file or directory that has been recently accessed is more likely to be accessed in the future.

That is, similar to a theory of 20:80, a part of the address space is frequently requested for the writing operation and the rest of the address space is rarely requested for the writing operation once the writing request is done. The part of the address space that is frequently requested for the writing operation is called a hot page and the rest of the address space that is rarely requested for the writing operation are each called a cold page. The classification of the address spaces as hot or cold pages and the storing of the classified data will now be described in more detail with reference to FIG. 8.

Figure 8:
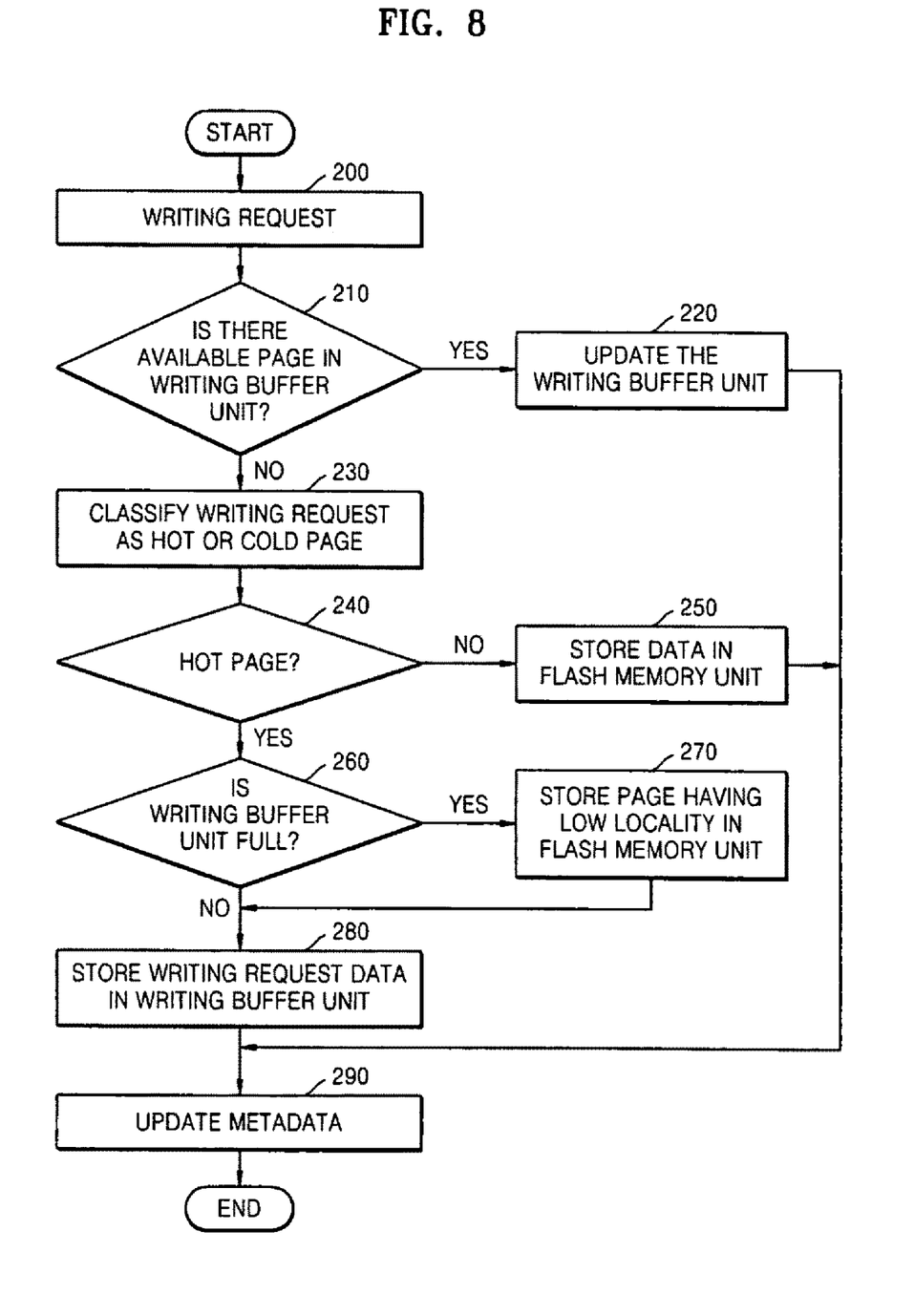
FIG. 8 is a flowchart illustrating a data storage method of the data storage system of FIG. 7.

FIG. 8 is a flowchart illustrating a data storage method of the data storage system of FIG. 7.

Referring to FIGS. 7 and 8, the memory control unit 131 receives a data writing request from the host 110 through the I/O interface unit 120 (Step 200). At this point, data is transferred in a unit of a page and the memory control unit 131 receives a logical address designating a write target page. The memory control unit 131 stores the logical address in the RAM 132. The memory control unit 131 determines if there is a write target page having an address identical to that of the write target page for the writing request in the writing buffer unit 140 of the memory unit M1 (Step 210). When it is determined there is a write target page having an address identical to that of the write target page for the writing request in the writing buffer unit 140 of the memory unit M1, the memory control unit 131 updates the address of the writing buffer unit 140 regardless of the page classification (Step 220).

When it is determined there is no write target page having an address identical to that of the write target page for the writing request in the writing buffer unit 140 of the memory unit M1, the page specification unit 133 classifies the writing request as a hot or cold page according to the frequency of the writing request (Step 230). That is, the page classification unit 133 estimates the probability of an amendment using the temporal locality appearing in the writing operation and classifies the writing request as a hot or cold page with reference to the estimation. The page classification is done according to the following method.

First, the writing request may be classified by a method using the LRU software. This method is based on the temporal locality that a page that is not accessed for a long time is less likely to be accessed in the future. That is, one LRU Queue (hereinafter "LRU Q") is managed and it is determined if an address region corresponding to a new writing request is registered in the LRU Q when the new writing request is input. When it is determined that an address region corresponding to a new writing request is registered in the LRU Q, it is regarded that there was a writing request for the address region during the former writing operation. Therefore, the writing request is classified as a hot page. When it is determined that the address region corresponding to a new writing request is not registered in the LRU Q, the writing request is classified as a cold page. The classified writing request is added to the LRU Q.

Second, the writing request may be classified by a method adding a count value to the address receiving the writing request. At a time when the writing request is generated, a specific count value is set and the specific count value gradually reduces as time elapses. When a predetermined time (e.g., 10 minutes) has lapsed, the count value is set as "0". At this point, the writing request generated in the region where the count value is not "0" is classified as a hot page and the writing request generated in the region where the count value is "0" is classified as a cold page.

The writing request can be classified by the locality extracted by a variety of other methods such as a method using a hardware cash structure.

Although the writing request is classified into two grades such as hot and cold pages according to the frequency in the foregoing description, the present invention is not limited to this case. That is, the writing request may be classified into three grades such as high, middle and low grades according to the frequency.

Referring again to FIG. 8, it is determined if the writing request is classified as a hot page (Step 240). When it is determined that the writing request is classified as a cold page, the memory control unit 131 directly stores the writing requested data classified as a cold page in the flash memory unit 150 without temporarily storing the data in the writing buffer unit 140 (Step 250). At this point, the writing requested data may be stored in the MLC flash memory 150b of the flash memory unit 150. Alternatively, the writing requested data may be stored in the flash memory unit 150 via the writing buffer unit 140 when the writing buffer unit 140 is used to improve the performance. As a result, the number of deleting operations performed on the flash memory unit 150 can be reduced.

In Step 240, when it is determined that the writing request is classified as a hot page, the memory control unit 131 determines if the writing buffer unit 140 is full (Step 260). When it is determined that the writing buffer unit 140 is full, one of the pages of the writing buffer unit 140, which has the lowest locality (i.e, the lowest using frequency), is stored in the flash memory unit 150 (Step 270). At this point, the page having the lowest locality may be stored in the SLC flash memory 150a of the flash memory unit 150.

That is, one of the pages stored the writing buffer unit 140, which was accessed the longest time ago, is selected and the selected page is stored in the SLC flash memory 150a of the flash memory unit 150. Then, the writing request is stored in a range, in which the accessed page was stored, of the writing buffer unit 140.

Then, when the writing buffer unit 140 is not full or an additional space is generated in the writing buffer unit 140 in Step 270, the writing requested data are stored in the writing buffer unit 140 (Step 280). For example, when it is assumed that the writing request is generated in order of pages A1, B, A2, C, D, E, F, G, H, and A3 for the address spaces A through Z and the address space A is classified as the hot page and the pages B through H are classified as the cold pages, the writing request for the pages A1, A2 and A3 can be processed in the writing buffer even if the writing buffer has a size that can store only one flash page. Therefore, an advantage that only the page A3 is stored in the flash memory unit can be actually realized.

Alternatively, when the writing buffer unit 140 includes a plurality of writing buffers, the data classified as a hot page can be stored in a first writing buffer and the data classified as a cold page can be stored in a second writing buffer. Then, the data classified as the cold page and stored in the second writing buffer can be stored in the SLC flash memory 150a of the flash memory unit 150.

Alternatively, when the page classification unit 133 classifies the writing requested data into three grades, the memory control unit 131 stores the data having high, middle and low using frequencies in first and second writing buffers and the MLC flash memory 150b of the flash memory unit 150, respectively.

Alternatively, the memory control unit 131 temporarily stores the data having high, middle and low using frequencies in first, second and third writing buffers, respectively. Then, the data stored in the third writing buffer moves to and is stored in one of the SLC or MLC flash memories 150a and 150b of the flash memory unit 150.

As described above, after the writing requested data is stored in the writing buffer unit 140 and the metadata is updated (Step 290).

In the data storage system according to the present invention, the data is written or read using a parallel input/output method by arranging an appropriate number of non-volatile memory buffers and flash memory banks in parallel considering a relative operation speed between a non-volatile memory device and a flash memory device. Therefore, a large capacity of data can be continuously processed, thereby preventing overflow and increasing writing/reading speed.

In addition, data deletion caused by unexpected accidents such as power being turned off when some data has not been stored in the flash memory device can be prevented, thereby stably maintaining the data.

Furthermore, the non-volatile memory buffer unit can be used as the cash for the reading operation and thus the XIP (execution in Place) support can be added to the NAND-type flash memory by supporting the data input/output in a unit of a byte.

In addition, the data classified as a hot page (having a high writing request frequency) is recorded in the writing buffer (e.g., a non-volatile RAM) and the data classified as a cold page (having a low writing request frequency) is recorded in the flash memory unit. Therefore, writing speed increases. Furthermore, since the writing buffer is formed of a non-volatile RAM such as an MRAM, a PRAM, an FRAM and the like, data can be permanently stored and be read and write having a capacity (e.g., 8-byte) less than the page unit of the flash memory. In addition, since the flash memory includes the SLC and MLC flash memories, memory efficiency and function can be enhanced. Since only data classified as a cold page is recorded in the flash memory unit, the number of writing operations for the flash memory can be reduced and thus the number of deleting operations can also be reduced. The reduction in the number of the deleting operations increases the service life of the flash memories.

While the present invention has been particularly shown and described with reference to exemplary embodiments thereof, it will be understood by those of ordinary skill in the art that various changes in form and details may be made therein without departing from the spirit and scope of the present invention as defined by the following claims.

For example, additional components may be further added between the host unit and the storage unit. In addition, other types of the non-volatile memory chips can be used to form the writing buffer unit. The writing buffer units may include different types of non-volatile memory devices. In addition, the flash memory unit may include only one of the SLC and MLC flash memories.

What is claimed is:

1. A data storage system comprising:
a host unit;
a storage unit; and
a first input/output bus functioning as an interface between the host unit and the storage unit,
wherein the storage unit includes a non-volatile memory buffer unit and a flash memory unit, the non-volatile memory buffer unit including a plurality of buffers arranged in parallel and the flash memory unit including a plurality of data storage devices arranged in parallel to input and output data using a parallel method,
wherein a number of buffers included in the non-volatile memory buffer unit is greater than a number of data storage devices included in the flash memory unit.

2. The data storage system of claim 1, wherein each buffer is a bank having a predetermined data storage capacity.

3. The data storage system of claim 1, wherein each buffer is a non-volatile memory chip.

4. The data storage system of claim 3, wherein the non-volatile memory chip is selected from the group consisting of an MRAM, a PRAM, an FRAM, and a non-volatile polymer memory chip.

5. The data storage system of claim 1, wherein each data storage device is a bank and each bank includes a plurality of pages each having a predetermined data storage capacity.

6. The data storage system of claim 5, wherein a data storage capacity of each buffer is equal to, or N (N=1, 2, 3) times, that of each page.

7. The data storage system of claim 1, wherein each data storage device is a flash memory chip.

8. The data storage system of claim 1, wherein a data storage capacity of each buffer is equal to, or N (N=1, 2, 3) times, a block size that is a deleting unit of the flash memory.

9. The data storage system of claim 1, wherein the first input/output bus is selected from the group consisting of an USB, a PCMCIA, an ISA, and a PCI.

10. The data storage system of claim 1, wherein the non-volatile memory buffer unit and the flash memory unit are formed in a single chip.

11. The data storage system of claim 1, wherein the storage unit further includes a flash translation layer and a second input/output bus functioning as an interface between the non-volatile memory buffer unit and the flash memory unit.

12. The data storage system of claim 1, wherein the storage unit is provided in the form of a card that can be detachably installed on the host unit.

13. The data storage system of claim 1, wherein the host unit further includes a first file system, a second file system, a flash translation layer interfacing with the first file system, and a device driver interfacing with the second file system.

14. The data storage system of claim 1, wherein the flash memory unit includes a NAND-type SLC flash memory and a NAND-type MLC flash memory.

15. A method of writing data in a data storage system comprising a host unit, a storage unit and a first input/output bus functioning as an interface between the host unit and the storage unit, wherein the storage unit includes a non-volatile memory buffer unit and a flash memory unit, the non-volatile memory buffer unit including a plurality of buffers arranged in parallel and the flash memory unit including a plurality of data storage devices arranged in parallel, the method comprising:
writing data in a first buffer of the plurality of buffers;
writing data in a second buffer of the plurality of buffers;
writing data in a third buffer of the plurality of buffers;
writing the data written in the first buffer in a first page of a first data storage device of the plurality of data storage devices; and
writing the data written in the second buffer in a first page of a second data storage device of the plurality of data storage devices,
wherein the writing of the data in the second buffer and the writing of the data written in the first buffer in the first page are simultaneously performed and the writing of the data in the third buffer and the writing of the data written in the second buffer in the first page are simultaneously performed, wherein a number of buffers included in the non-volatile memory buffer unit is greater than a number of data storage devices included in the flash memory unit.

16. The method of claim 15, further comprising writing the data written in the third buffer in a second page of the first data storage device of the plurality of data storage devices, wherein new data is written in the first buffer during the writing of the data written in the third buffer in a second page of the first data storage device of the plurality of data storage devices.

17. The method of claim 16, further comprising deleting the data written in the first buffer before the new data is written in the first buffer.

18. The method of clam 15, wherein each buffer is a bank having a predetermined storage capacity.

19. The method of claim 15, wherein each buffer is one selected from the group consisting of an MRAM, a PRAM, an FRAM, and a non-volatile polymer memory chip.

20. The method of claim 15, wherein the first and second data storage devices are first and second banks, respectively, and each of the first and second banks includes a plurality of pages each having a predetermined data storage capacity.

21. The method of claim 20, wherein a data storage capacity of each buffer is equal to, or N (N=1, 2, 3) times, that of the page.

22. The method of claim 15, wherein the first and second data storage devices are first and second flash memory chips, respectively.

23. The method of claim 15, wherein a data storage capacity of each buffer is equal to, or N (N=1, 2, 3) times, a block size that is a deleting unit of the flash memory.

24. The method of claim 15, wherein the non-volatile memory buffer unit and the flash memory unit are formed in a single chip.

25. The method of claim 15, wherein the storage unit further includes a flash translation layer and a second input/output bus functioning as an interface between the non-volatile memory buffer unit and the flash memory unit.

26. The method of claim 15, wherein the storage unit is provided in the form of a card that can be detachably installed on the host unit.

27. The method of claim 15, wherein the host unit further includes a first file system, a second file system, a flash translation layer interfacing with the first file system, and a device driver interfacing with the second file system.

28. The method of claim 15, wherein the flash memory unit includes a NAND-type SLC flash memory and a NAND-type MLC flash memory.

29. A method of writing data in a data storage system comprising a host unit, a storage unit and a first input/output bus functioning as an interface between the host unit and the storage unit, wherein the storage unit includes a non-volatile memory buffer unit and a flash memory unit, the non-volatile memory buffer unit including a plurality of buffers arranged in parallel and the flash memory unit including a plurality of data storage devices arranged in parallel, the method comprising:

writing data written in a first page of a first data storage device of the plurality of data storage devices in a first buffer of the plurality of buffers;

writing data written in a first page of a second data storage device of the plurality of data storage devices in a second buffer of the plurality of buffers;

writing data written in a second page of the first data storage device of the plurality of data storage devices in a third buffer of the plurality of buffers;

wherein the writing of the data written in the first page of the second data storage device starts after the writing of the data written in the first page of the first data storage starts and ends after the writing of the data written in the first page of the first data storage device ends and the writing of the data written in the second page of the first storage device starts after the writing of the data written in the first page of the first data storage device ends; and while the writing of the data written in the first page of the second data storage device in the second buffer is performed, the data written in the first buffer is read and while the writing of the data written in the second page of the first data storage device in the third buffer is performed, the data written in the second buffer is read, wherein a number of buffers included in the non-volatile memory buffer unit is greater than a number of data storage devices included in the flash memory unit.

30. The method of claim 29, further comprising writing data written in a second page of a second data storage device in the first buffer after the data written in the first buffer is read and before the writing of the data written in the second page of the first data storage device in the third buffer ends.

31. The method of claim 29, wherein the buffer is one of a bank and a non-volatile memory chip having a predetermined data storage capacity.

32. The method of claim 29, wherein the first and second data storage devices are first and second banks, respectively, and each of the first and second banks includes a plurality of pages each having a predetermined data storage capacity.

33. The method of claim 29, wherein the first and second data storage devices are first and second flash memory chips, respectively.

34. The method of claim 29, wherein a data storage capacity of the first buffer is equal to, or N (N=1, 2, 3) times, that of the first page.

35. The method of claim 29, wherein a data storage capacity of the first buffer is equal to, or N (N=1, 2, 3) times, a block size that is a deleting unit of the flash memory.

36. The method of claim 29, wherein the non-volatile memory buffer unit and the flash memory unit are formed in a single chip.

37. The method of claim 29, wherein the storage unit further includes a flash translation layer and a second input/output bus functioning as an interface between the non-volatile memory buffer unit and the flash memory unit.

38. The method of claim 29, wherein the storage unit is provided in the form of a card that can be detachably installed on the host unit.

39. The method of claim 29, wherein the host unit further includes a first file system, a second file system, a flash translation layer interfacing with the first file system, and a device driver interfacing with the second file system.

40. The method of claim 29, wherein the flash memory unit includes a NAND-type SLC flash memory and a NAND-type MLC flash memory.

* * * * *

UNITED STATES PATENT AND TRADEMARK OFFICE
CERTIFICATE OF CORRECTION

PATENT NO. : 7,689,761 B2 Page 1 of 1
APPLICATION NO. : 11/485346
DATED : March 30, 2010
INVENTOR(S) : Keunsoo Yim et al.

It is certified that error appears in the above-identified patent and that said Letters Patent is hereby corrected as shown below:

Column 17, Lines 40-41, change "non- volatile" to --non-volatile--.

Signed and Sealed this

Fifteenth Day of June, 2010

David J. Kappos
*Director of the United States Patent and Trademark Office*